(12) United States Patent
Blom

(10) Patent No.: US 7,541,772 B2
(45) Date of Patent: Jun. 2, 2009

(54) CONNECTOR FOR CONNECTING AN ELECTRONIC DEVICE TO A CHARGING APPARATUS AND FOR CONTROLLING THE DEVICE

(75) Inventor: Carl-Gustaf Blom, Lysekill (SE)

(73) Assignee: Perlos Oyj, Vantaa (FI)

(*) Notice: Subject to any disclaimer, the term of this patent is extended or adjusted under 35 U.S.C. 154(b) by 240 days.

(21) Appl. No.: 10/592,068

(22) PCT Filed: Mar. 7, 2005

(86) PCT No.: PCT/FI2005/050065
§ 371 (c)(1),
(2), (4) Date: Nov. 8, 2006

(87) PCT Pub. No.: WO2005/086314
PCT Pub. Date: Sep. 15, 2005

(65) Prior Publication Data
US 2007/0188128 A1    Aug. 16, 2007

(30) Foreign Application Priority Data
Mar. 8, 2004    (FI)    .................................. 20040368

(51) Int. Cl.
*H01M 10/46* (2006.01)
(52) U.S. Cl. ........................................................ 320/114
(58) Field of Classification Search ................. 320/107, 320/111, 114, 115
See application file for complete search history.

(56) References Cited

U.S. PATENT DOCUMENTS
6,108,097 A    8/2000    Suzuki et al.

FOREIGN PATENT DOCUMENTS
DE    2435104    2/1975
DE    20015944    1/2001
EP    0 509 284    10/1992

*Primary Examiner*—Edward Tso
(74) *Attorney, Agent, or Firm*—Young & Thompson

(57) ABSTRACT

An electronic device includes a rechargeable power source and a recharging connector arrangement arranged at least partly on an outer surface of the device and configured to connect the power source to a charging apparatus thereof. The recharging connector arrangement is configured to operate as a user interface of the device to control functions of the device.

13 Claims, 2 Drawing Sheets

CONNECTOR FOR CONNECTING AN ELECTRONIC DEVICE TO A CHARGING APPARATUS AND FOR CONTROLLING THE DEVICE

BACKGROUND OF THE INVENTION

The invention relates to an electronic device comprising a rechargeable power source, a recharging connector arrangement arranged at least partly on an outer surface of the device and configured to connect the power source to a charging apparatus thereof.

The invention further relates to a recharging connector arrangement for connecting a power source of an electronic device to a charging apparatus thereof.

Electronic devices—which hereinbelow in the present application are referred to as devices—comprise a rechargeable battery that can be charged without detaching the battery from the device. Typical examples of such devices include mobile devices, such as mobile telephones, laptops, communicators, portable computers or other such devices or devices alleviating or enhancing the use thereof, such as headsets, microphones, voice or image recorders, etc. Furthermore, electronic devices may be domestic appliances, shavers, etc.

Advances in electronics and other technology enable the size and weight of devices of the above-discussed type to be decreased continuously, irrespective of the fact that the operating characteristics of the devices have become more and more versatile.

A problem with the aforementioned devices is how to arrange buttons that are necessary for enabling the devices to be used so as to make the usability of the devices reliable, easy and simple. For example, the buttons should be large to enable good usability, but often the surface of a device does not provide enough room for a necessary number of buttons that are large enough. A further problem is that the structure of button solutions used as a user interface is complex, which may cause a considerable amount of configuration costs while manufacturing such devices.

BRIEF DESCRIPTION OF THE INVENTION

An object of the present invention is to provide a novel and improved electronic device and a recharging connector arrangement so as to avoid aforementioned drawbacks.

The electronic device of the invention is characterized in that the recharging connector arrangement is configured to operate also as a user interface of the device to control functions of the device.

Furthermore, the recharging connector arrangement of the invention is characterized in that the recharging connector arrangement is configured to operate as a user interface of the device to control functions of the device.

The idea underlying the invention is that a recharging connector is utilized as a user interface to enable the operation of the device to be controlled.

An advantage of the invention is that the number of buttons in the user interface may be reduced, in some devices even to such an extent that no other buttons are necessary at all. Furthermore, the device becomes quicker and simpler to assemble when the number of components to be assembled decreases. This means lower manufacturing costs. Another advantage is that the appearance of the device becomes simpler and more sophisticated.

The idea underlying a preferred embodiment of the invention is that the recharging connector arrangement includes two recharging connectors arranged at a distance from one another, the distance being smaller than the width of a finger, and that the two recharging connectors are configured to operate as operation control means when, using a finger, either a capacitive coupling or a resistive coupling, or a combination of capacitive and resistive coupling, is arranged therebetween. An advantage is that the functions of the device are simple to control.

The idea underlying another preferred embodiment of the invention is that the recharging connector arrangement is configured to control several different functions. An advantage is that since several different functions may be controlled using one and the same means, the number of buttons in a user interface may be reduced radically.

BRIEF DESCRIPTION OF THE DRAWINGS

The invention is described in closer detail in the accompanying drawings, in which.

For the sake of clarity, the figures show the invention in a simplified manner. Like references identify like elements.

DETAILED DESCRIPTION OF THE INVENTION

Figure 1:
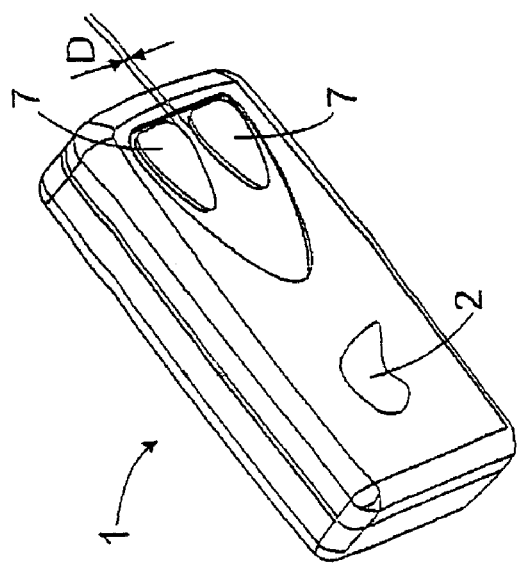
FIG. 1 is a schematic perspective view showing a device of the invention.
Figure 3:
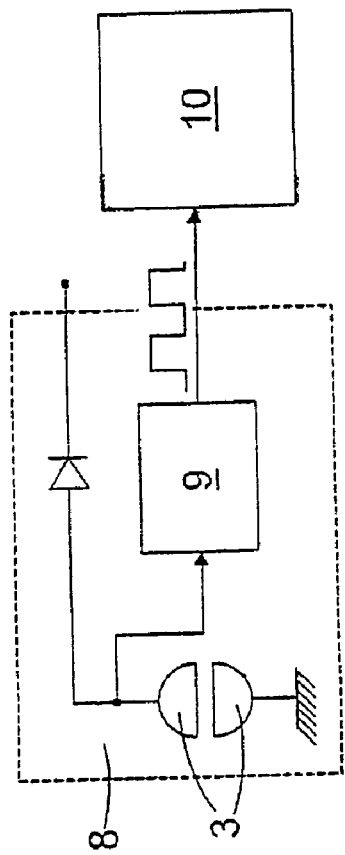
FIG. 3 is a schematic perspective view showing a recharging connector of the device shown in FIG. 1.
Figure 2:
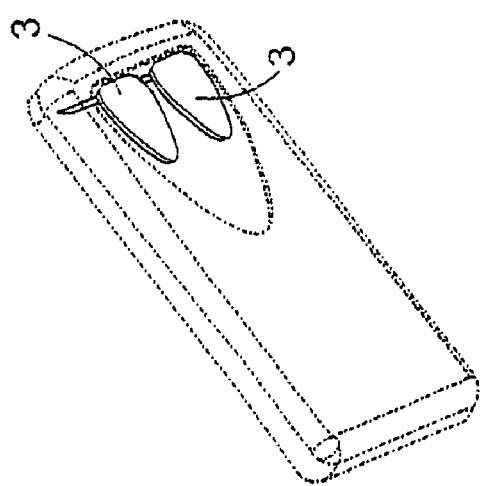
FIG. 2 is a schematic view showing how recharging connectors are located in the device shown in FIG. 1.

FIG. 1 is a schematic perspective view showing a device of the invention, FIG. 2 shows how recharging connectors are located in the particular device, and FIG. 3 is a schematic perspective view showing a recharging connector of the same device. The device 1 shown in the figures can be any device as explained above comprising a rechargeable battery that can be charged without detaching the battery from the device. The device 1 operates wirelessly and its connection to a terminal device is provided, e.g., by employing a Bluetooth principle or another such principle known per se.

The device 1 includes a rechargeable battery 2 arranged inside the outer covers of the device. The functions of the device 1 derive their energy from the battery. The battery 2 may be charged by a charging apparatus, which is not shown in the figures.

The battery 2 is connected to two recharging connectors 3, a first recharging connector to a first pole of the battery and a second recharging connector to a second pole of the battery. The recharging connectors 3 are manufactured of an electrically conductive material, such as a metal, alloy, electrically conductive plastics or a plastics mixture.

The recharging connectors 3 are located on the outer surface of the device 1 to enable the recharging connectors to provide an electrical contact with the charging apparatus required by a charging event.

FIG. 3 is a perspective view showing one recharging connector of the device 1. The recharging connector 3 comprises a first contact part 4 that comes into contact with a pole of the battery 2 arranged in the device. The first contact part 4 is provided with a flexible projection 5 that presses against the pole of the battery, thus ensuring a reliable contact.

The recharging connector further comprises a second contact part 6 arranged at an angle with respect to the first contact part. The second contact part 6 has an outer surface that constitutes a contact surface 7. The recharging connector is arranged in the device 1 such that the contact surface provides a part of the outer surface of the device.

The contact surfaces 7 of the recharging connectors 3 are arranged at a distance D from one another, as shown in FIG. 1. The distance D is smaller than the width of a finger. This means that the contact surfaces 7 are arranged so close to one another that a user of the device, using one and the same finger, may easily and reliably press or touch both contact surfaces 7 simultaneously.

It is to be noted that in FIG. 3, the recharging connector is shown in a position wherein the contact surface 7 cannot be seen since it resides behind the second contact part 6, out of sight.

When the battery 2 of the device 1 is to be charged, the recharging connector of the charging apparatus carrying out the charging is connected to the second contact parts 6 of the recharging connectors 3. The battery 2 is charged through an electrical circuit thus provided.

The recharging connectors 3 of the device are also configured to operate as a user interface to control functions of the device 1. The user interface operates as described below.

First, the user of the device 1 places one of his or her fingers such that it comes into contact with the contact surface 7 of both recharging connectors. The finger thus provides an electrical connection between the two contact surfaces 7.

Figure 4:
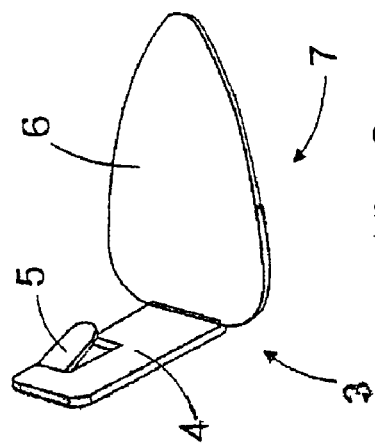
FIG. 4 is a schematic view showing a recharging connector arrangement of the invention.

Next, a sensor circuit 9 included in a recharging connector arrangement 8—see FIG. 4—detects the electrical connection and an impedance thereof. When the detected magnitude of the impedance resides within determined limit values, the sensor circuit 9 interprets that the electrical connection is intended as a signal to control the functions of the device. On the basis of the duration of the signal and the number of signals, the sensor circuit identifies a function the user wishes to control.

In other words, the user of the device may control several different functions by altering the duration of contact between his or her finger and the contact surfaces 7 as well as the number of contacts.

For example, in the case where the device 1 is a headset, the recharging connector arrangement may be used for controlling functions e.g. in the following manner:
- one very long and continuous contact when the device is switched off, duration e.g. 3 seconds or more=switch the device on,
- one quick contact, duration e.g. 0.5 seconds or less=answer a call,
- two quick successive contacts, duration of both e.g. 0.5 seconds or less=increase volume,
- one long contact, e.g. 1 to 2 seconds=decrease volume,
- one very long and continuous contact when the device is switched on, duration e.g. 3 seconds or more=switch the device off.

It is further to be noted that the above-disclosed functions and the manners of controlling the same are only exemplary.

The coupling between the contact surfaces 7 may be based, e.g., on a capacitive or a resistive coupling or combination thereof caused by a finger. The principles of such couplings are per se obvious to one skilled in the art, so they will not be discussed in closer detail herein.

When a charging apparatus is connected to the recharging connectors 3, the resulting impedance resides below the aforementioned limit values. Therefore, the connecting of the charging apparatus is not interpreted as an attempt to control the functions of the device. If a short circuit occurs between the recharging connectors 3, the impedance also resides below the aforementioned limit values, in which case the short circuit is not interpreted as an attempt to control the functions of the device. When there is no finger present at the connectors 3 the impedance value is far above the upper limit value.

FIG. 4 schematically shows a recharging connector arrangement of the invention.

The recharging connectors 3 are connected to arrangements known per se necessary for charging a battery that will not be discussed in further detail herein.

The recharging connectors 3 are a part of the recharging connector arrangement 8 that enables functions of a device to be controlled. The recharging connector arrangement 8, in addition to the recharging connectors 3, includes a sensor circuit 9 configured to identify situations wherein a user of the device, using his or her finger, has connected the recharging connectors 3 to one another. Such an identification event is based on impedance limit values already discussed above. The duration of couplings residing within the impedance limit values as well as the number of couplings determine a control signal transmitted by the sensor circuit to control the operation of a circuit 10 to be controlled. In the case of a headset, the circuit 10 to be controlled may be a radio circuit.

An additional benefit is that the contact principle of the invention does require a very minor touch by the finger making it easier to operate often small and light electronic devices.

Figure 5:
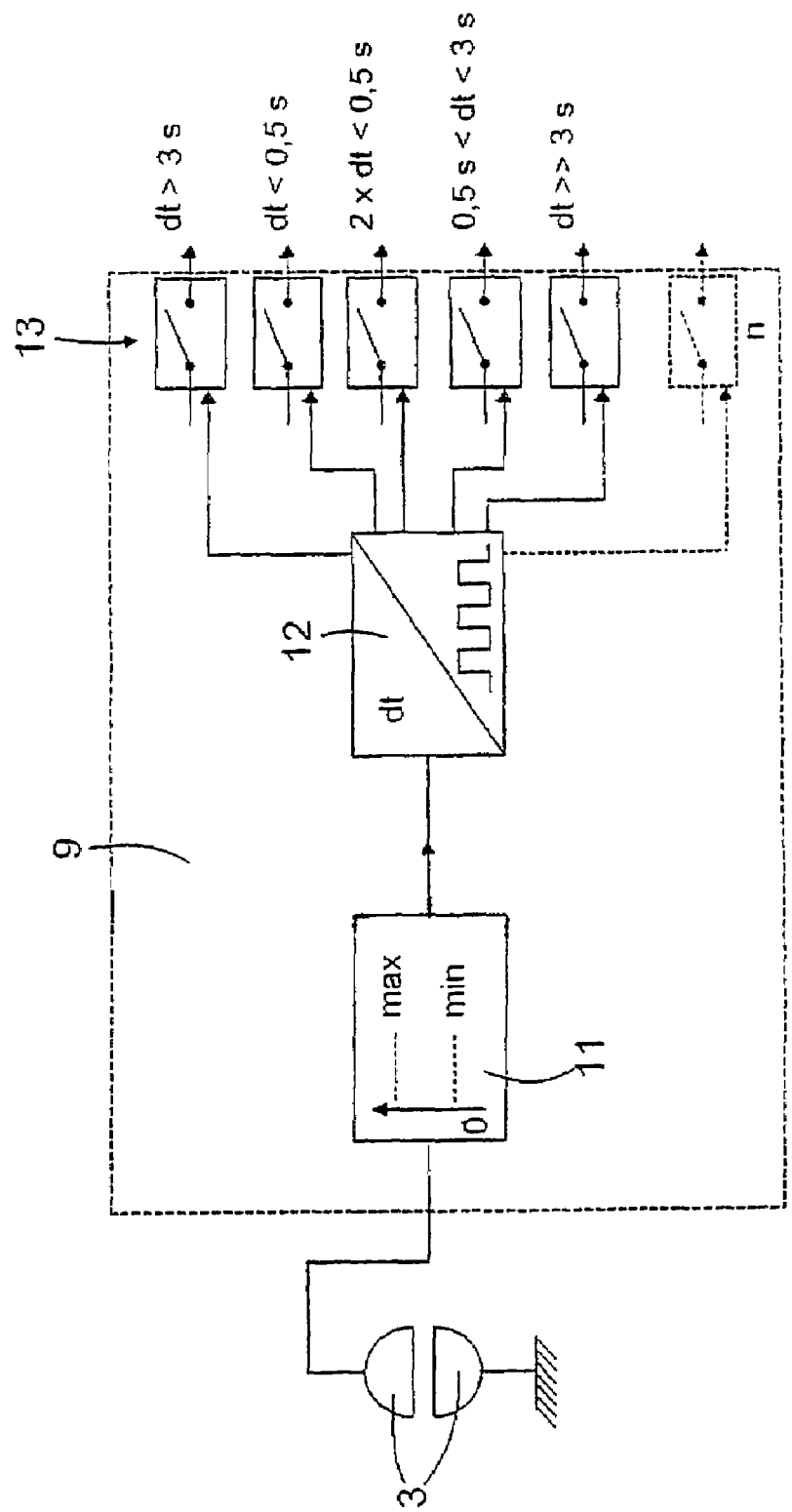
FIG. 5 is a schematic view showing a principle how to realize the recharging connector arrangement shown in FIG. 4.

FIG. 5 schematically shows a principle how to realize a recharging connector arrangement of the invention. It is to be noted here that arrangements necessary for charging a battery are not shown in FIG. 5. The sensor circuit 9 includes an impedance sensor 11 and a counter circuit 12.

When the recharging connectors 3 are connected to each other such that the impedance resides within set values, this is interpreted as a signal for the counter circuit 12. The impedance sensor 11 sends an output signal to the counter circuit 12. The duration of the output signal corresponds to the time the recharging connectors 3 are connected to each other such that the impedance resides within set values.

The counter circuit 12 includes a clock that is activated on any incoming signal from the impedance sensor 11. "dt" in FIG. 5 represents the time the recharging connectors 3 are connected to each other such that the impedance resides within set values. The counter circuit 12 generates a continuous pulse signal with duration dt and measures the number of pulses generated during the incoming signal from the impedance sensor 11. The duration of an active period of the clock can be, for example, 20 pulses. Within this timeframe any function control commands has to be performed.

FIG. 5 shows an example how the number of the pulses can be converted to a function control command, which is then sent to the circuit to be controlled:
- More than 10 pulses=Start/ON, corresponding to dt>3 seconds
- 1 but not more than 3=Answer, corresponding to dt>0.5 seconds
- As above but repeated twice=Volume up, corresponding to 2×dt<0.5 seconds
- More than 3 but not 10=Volume down, corresponding to 0.5 seconds<dt<3 seconds
- More than 10 pulses when ON=OFF, corresponding to dt>>3 seconds.

It is to be noted here that this is just one example on how to realize the invention.

For sake of clarity, FIG. 5 shows an embodiment where separate analogue type switches 13 are used as output switches. It is clear for a person skilled in the art that output switches are preferably implemented with a processor based solutions. The lowest switch 13, marked with symbol "n", represents additional function(s) that can be added to be controlled by the recharging connector arrangement. The dt value range shown in connection with each switch 13 indicates the dt value range which activates the function control command that respective switch 13 is depicting.

The sensor circuit 9 can be implemented, for example, with a CMOS technique or any other low current/low voltage technique. In CMOS, the current drain is microampere in magnitude. It means that the current consumption of the circuit is less than the self-discharge of the battery.

The drawings and the related description are only intended to illustrate the idea of the invention. The details of the invention may vary within the scope of the claims. For example, the recharging connector 3 can be implemented so that it does not have the first contact part 4. In that case, the first contact part is located elsewhere in the device and it is connected to the recharging connector with a wire or other electrical conduit. The recharging connector can be realized in many ways with, for example, metal sheets, conductive foils, metallized or conductive plastics, MID technique (Moulded Interconnect Device), etc.

The invention claimed is:

1. An electronic device comprising a rechargeable power source, a recharging connector arrangement arranged at least partly on an outer surface of the device and configured to connect the power source to a charging apparatus thereof, wherein the recharging connector arrangement is configured to operate as a user interface of the device to control functions of the device.

2. An electronic device as claimed in claim 1, wherein the recharging connector arrangement includes two recharging connectors arranged at a distance from one another, and wherein the two recharging connectors are configured to operate as operation control means when a capacity coupling is arranged there between.

3. An electronic device as claimed in claim 1, wherein the recharging connector arrangement includes two recharging connectors arranged at a distance from one another, and wherein the two recharging connectors are configured to operate as operation control means when a resistive coupling is arranged there between.

4. An electronic device as claimed in claim 1, wherein the coupling is to be provided by touching both recharging connectors with one finger simultaneously.

5. An electronic device as claimed in claim 1, wherein the recharging connector arrangement is configured to control several different functions.

6. An electronic device as claimed in claim 5, wherein the recharging connector arrangement includes sensor means arranged to identify functions to be controlled on the basis of the duration of a coupling and/or the number of couplings of the recharging connectors.

7. An electronic device as claimed in claim 1, wherein the electronic device is a headset.

8. A recharging connector arrangement for connecting a power source of an electronic device to a charging apparatus thereof, wherein the recharging connector arrangement is configured to operate as a user interface of the device to control functions of the device.

9. A recharging connector arrangement as claimed in claim 8, wherein the recharging connector arrangement includes two recharging connectors arranged at a distance from one another, and wherein the two recharging connectors are configured to operate as a user interface of the electronic device when a capacity coupling is arranged there between.

10. A recharging connector arrangement as claimed in claim 8, wherein the recharging connector arrangement includes two recharging connectors arranged at a distance from one another, and wherein the two recharging connectors are configured to operate as operation control means when a resistive coupling is arranged there between.

11. A recharging connector arrangement as claimed in claim 8, wherein the recharging connector arrangement is configured to control several different functions.

12. A recharging connector arrangement as claimed in claim 11, wherein the recharging connector arrangement includes sensor means arranged to identify functions to be controlled on the basis of the duration of a coupling and/or the number of couplings of the recharging connectors.

13. A recharging connector arrangement as claimed in claim 8, wherein the electronic device is a headset.

* * * * *